United States Patent [19]

Ochi

[11] Patent Number: 5,128,608
[45] Date of Patent: Jul. 7, 1992

[54] OPTICAL INSTRUMENT TRANSFORMER

[75] Inventor: Naoki Ochi, Amagasaki, Japan

[73] Assignee: Mitsubishi Denki Kabushiki Kaisha, Tokyo, Japan

[21] Appl. No.: 603,363

[22] Filed: Oct. 26, 1990

[30] Foreign Application Priority Data

Jan. 9, 1990 [JP] Japan .................... 2-2822

[51] Int. Cl.[5] .............. G01R 19/00; G01R 33/032
[52] U.S. Cl. .................... 324/96; 324/117 R
[58] Field of Search .......... 324/96, 127, 117 R, 324/142; 174/139

[56] References Cited

U.S. PATENT DOCUMENTS

| 3,324,393 | 6/1967 | Casey et al. | 324/127 |
| 3,413,055 | 11/1968 | De Jorbo | 324/96 |
| 4,894,609 | 1/1990 | Fujiki et al. | 324/96 |

FOREIGN PATENT DOCUMENTS

| 0209609 | 8/1989 | Japan | 324/96 |
| 0279519 | 11/1989 | Japan | 174/139 |

OTHER PUBLICATIONS

K. Gotoh et al. 1245 "Development of Apparatus for Detecting Segmented Region of a Transforming Station," 1990 National Convention IEE Japan; pp. 9-193, 9-194.

H. Yamanaka et al. G3-52 "Development of Apparatus for Monitoring Fult Point by an Optical Current Transformer in an Air Transforming Station", Record of the 1989 Kansai-Section Joint Convention of Institute of Electrical Engineering Japan, pp. G130.

P. Johnson, "A Magneto-Optic Current Transducer," IEEE 89 SM 732-9 PWRD, pp. 1-7.

K. Kyuma et al., "Fiber-Optic Voltage Sensor Using Electro-Optic $Bi_{12}GeO_{20}$ Single Crystal," Proceedings of the 2nd sensor Symposium 1982, pp. 33-37.

IEEE Transactions on Power Delivery, vol. 5, No. 2, Apr. 1990: "A High-Accuracy Optical Current Transformer for Electric Power Systems".

IEEE Journal of Quantum Electronics, vol. QE-18, No. 10, Oct. 1982: "Fiber Optic Measuring System for Electric Current by Using a Magnetooptic Sensor".

Primary Examiner—Ernest F. Karlsen
Attorney, Agent, or Firm—Oblon, Spivak, McClelland, Maier & Neustadt

[57] ABSTRACT

An optical instrument transformer can measure both current and voltage of the primary conductor. Measurement of current is made through modulation effect of a light signal by the optical magnetic-field sensor, and measurement of voltage is made through modulation effect of a light signal by the optical electric-field sensor, by measuring the voltage between a conductor member and an upper flange the of the a bushing, which has a value divided in a dividing ratio determined by the capacitance between the conductor member (4a) and the upper flange and the capacitance between the upper flange and ground.

6 Claims, 4 Drawing Sheets

OPTICAL INSTRUMENT TRANSFORMER

FIELD OF THE INVENTION

The present invention relates to an optical instrument transformer for measuring voltage and current.

DESCRIPTION OF THE RELATED ART

There is known an optical current transformer for measuring current in a primary conductor by utilizing an optical magnetic-field sensor.

FIG. 4 is partial cutaway view showing a conventional optical current transformer disclosed in 1989 National Convention IEE Japan "1245 Development for apparatus for detecting fault section of a substation".

In FIG. 4, a high potential is on a primary conductor 1 wherein a current to be measured flows. An iron core 2 with a gap makes a magnetic path linking the primary conductor 1. An optical magnetic-field sensor 3, such as an optical magnetic-field effect element, is disposed in the gap 2a of the iron core 2. A case 4 contains the iron core 2 and the optical magnetic-field sensor 3 therein and supports and fixes them. A bushing 5 has an upper flange 5a and a lower flange 5b made of metal at both ends thereof and insulates the case 4 from ground by supporting it with the upper flange 5a at the upper end thereof. The construction between the lower flange 5b at the lower end of the bushing 5 and ground is omitted from FIG. 4. Optical fibers 6a, 6b are inserted through and in the bushing, and one ends thereof are connected to the optical magnetic-field sensor 3, and another ends thereof are connected to a signal processing equipment 7.

Next, the operation of the conventional optical current transformer is elucidated. When a current flows in the conductor 1, a magnetic flux in proportion to the current flows through the iron core 2 and the gap 2a. A light signal emitted from a light emitting element of the signal processing equipment 7 travels through the optical fiber 6a and is inputted into the optical magnetic-field sensor 3. The inputted light signal is modulated in proportion to the magnetic field produced by the above-mentioned magnetic flux. The modulated light signal travels through the optical fiber 6b and is inputted into a light receiving element of the signal processing equipment 7. The signal processing equipment 7 converts the modulated light signal into an electric signal that is proportional to the current flowing in the primary conductor 1. Thereby, the high potential current of the primary conductor 1 can be measured in the circuit which is at the ground potential level.

The optical current transformer with the optical magnetic-field sensor for measuring current has a comparatively simple construction. But when a measurement of the potential of the primary conductor 1 is intended, it is necessary to add an inductive voltage transformer, for instrument, a coupling-capacitor voltage transformer or a proper optic transformer with voltage divider to the optic voltage transformer. Such a configuration induces a problem in that the equipment for measuring both current and voltage becomes large-sized and costly.

OBJECT AND SUMMARY OF THE INVENTION

The object of the present invention is to solve the above-mentioned problem and obtain an optical instrument transformer which enables measurement of both current and voltage.

These object are accomplished by an optical instrument transformer comprising;

an iron core with a gap which forms magnetic path linking a primary conductor, an optical magnetic-field sensor which is held in the gap of said iron core, a conductor member of a conductor material supports said iron core and is electrically connected to said primary conductor, a bushing which has a flange at top end thereof and insulates said flange from ground, an insulating support means provided between the flange made of conductive material and said conductor member, an optical electric-field sensor disposed at between said conductor member and said flange and a signal processing equipment optically connected with said optical magnetic-field sensor and said optical electric-field sensor by optic fibers which sends out light signal to said optical magnetic-field sensor and said optical electric-field sensor, receives light signal modulated by said sensors, and measures voltage and current of the primary conductor.

In the optical instrument transformer of the present invention, measurement of current is made through effect of light signal modulation by the optical magnetic-field sensor and similarly to the measurement in the conventional optical current transformer.

A potential which is proportional to the voltage applied to the primary conductor is induced on the conductor member of supporting member at the same time. That is, the induced potential is given as the one which is divided by a dividing ratio determined by both the first capacitance between the conductor member and the upper flange of the bushing and the second capacitance between the upper flange and ground appears between the conductor member and the upper flange of the bushing. The optical electric-field sensor disposed between the conductor member and the upper flange modulates light signal in proportion to the induced potential. Thereby measurement of the voltage is achieved through measurement of the intensity of modulation.

While the novel features of the invention are set forth particularly in the appended claims, the invention, both as to organization and content, will be better understood and appreciated, along with other objects and features thereof, from the following detailed description taken in conjunction with the drawings.

It will be recognized that some or all of the Figures are schematic representations for purposes of illustration and do not necessarily depict the actual relative sizes or locations of the elements shown.

DESCRIPTION OF THE PREFERRED EMBODIMENTS

Figure 1:
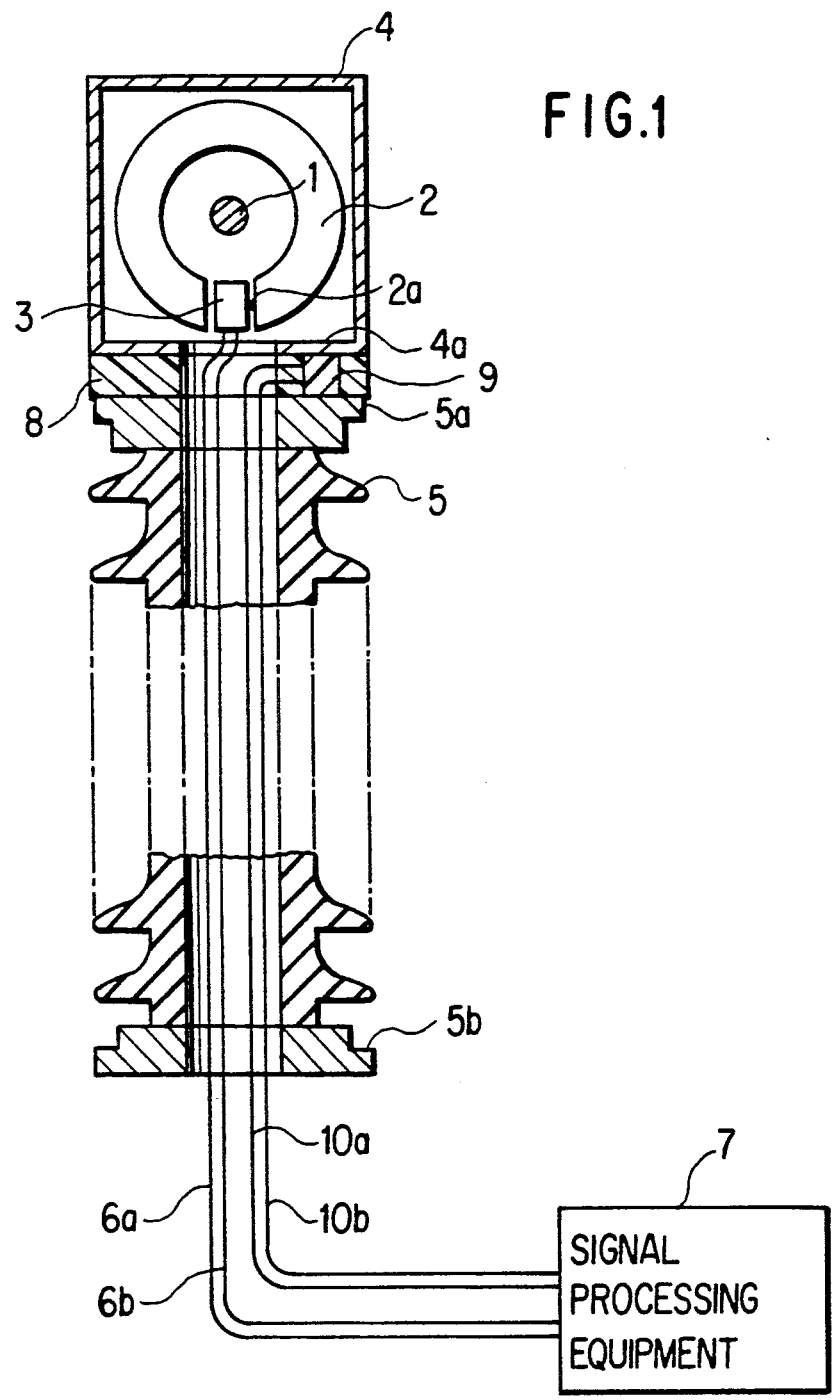
FIG. 1 is a partial cutaway view of a first embodiment of an optical instrument transformer in accordance with the present invention.

Hereafter, preferred embodiments of the present invention are explained with reference to the accompanying drawings. FIG. 1 is a partial cutaway view of a first embodiment of an optical instrument transformer in accordance with the present invention.

In FIG. 1, a high potential is on a primary conductor 1, wherein a current to be measured flows. An iron core 2 with a gap makes a magnetic path linking the primary conductor 1. An optical magnetic-field sensor 3 such as an optical magnetic-field effect element is disposed in the gap 2a of the iron core 2. A case 4 contains the iron core and the optical magnetic-field sensor 3 therein, and supports and fixes them as a support means. The case 4 is made of metal material such as stainless steel, and is electrically connected to the primary conductor 1. The lower part of the case 4 is a conductor member 4a. A bushing 5 having an upper flange 5a and a lower flange 5b of metal at the both ends thereof supports the case 4 by inserting an insulating supporter 8 between the upper flange 5a and the case 4. The construction between the lower flange 5b at the lower end of the bushing 5 and ground is omitted from FIG. 1. An optical electric-field sensor 9 (an example is described by Kazuo Kyuma et al. "Fiber-Optic Voltage Sensor Using Electro-Optic $Bi_{12}GeO_{20}$ Single Crystal" Proceedings of the 2nd Sensor Symposium, 1982. pp. 33-37) is disposed between the conductor member 4a and the upper flange 5a in the insulating supporter 8. Optical fibers 6a and 6b are lead in through the bushing 5, one ends thereof are connected to the optical magnetic-field sensor 3, and the other ends thereof are connected to a signal processing equipment 7. Optical fibers 10a and 10b are also lead in the bushing 5, one ends thereof are connected to the optical electric-field sensor 9, and the other ends thereof are connected to the signal processing equipment 7.

Next, the operation of the optical instrument transformer is elucidated. When a current flows in the conductor 1, a magnetic flux in proportion to the current flows through the iron core 2 and the gap 2a. A light signal emitted from a light emitting element of the signal processing equipment 7 travels through the optical fiber 6a and is inputted into the optical magnetic-field sensor 3. The inputted light signal is modulated in proportion to magnetic field produced by the above-mentioned magnetic flux. The modulated light signal travels through the optical fiber 6a and is inputted into a light receiving element of the signal processing equipment 7. The signal processing equipment 7 converts the modulated light signal into an electric signal that is proportional to the current flowing in the primary conductor 1. Thereby, the high potential current of the primary conductor 1 can be measured in the circuit which is at the ground potential level.

The case 4 of metal is at the same potential as the primary conductor 1 and its upper flange 5a is insulated therefrom, so that the voltage Vd across the conductor member 4a and the upper flange 5a is given as a voltage which is divided from the voltage V of the primary conductor 1 by a dividing ratio determined by a capacitance $C_1$ between the conductor member 4a and the upper flange 5a and a capacitance $C_2$ between the upper flange 5a and ground. That is, the voltage Vd is expressed by the following formula (1).

$$Vd = \{C_1/(C_1 + C_2)\} \times V \qquad (1)$$
$$= (\text{the dividing ratio}) \times V.$$

These capacitances $C_1$ and $C_2$ are determined by the structure (shape) of the optical instrument transformer. Furthermore, the voltage Vd is in proportion to the primary conductor voltage V, and an electric field originated from the voltage Vd is applied on the optical electric-field sensor 9.

A light signal emitted from the other light emitting element in the signal processing equipment 7 travels through the optical fiber 10a and is inputted into the optical electric-field sensor 9. The inputted light signal is modulated in proportion to the above-mentioned electric field by the optical electric-field sensor 9. The modulated light signal travels through the optical fiber 10b and is inputted into the other light receiving element of the signal processing equipment 7. The signal processing equipment 7 extracts an amount of demodulation and calculates the primary conductor voltage V from the amount of demodulation and the above-mentioned dividing ratio.

Figure 2:
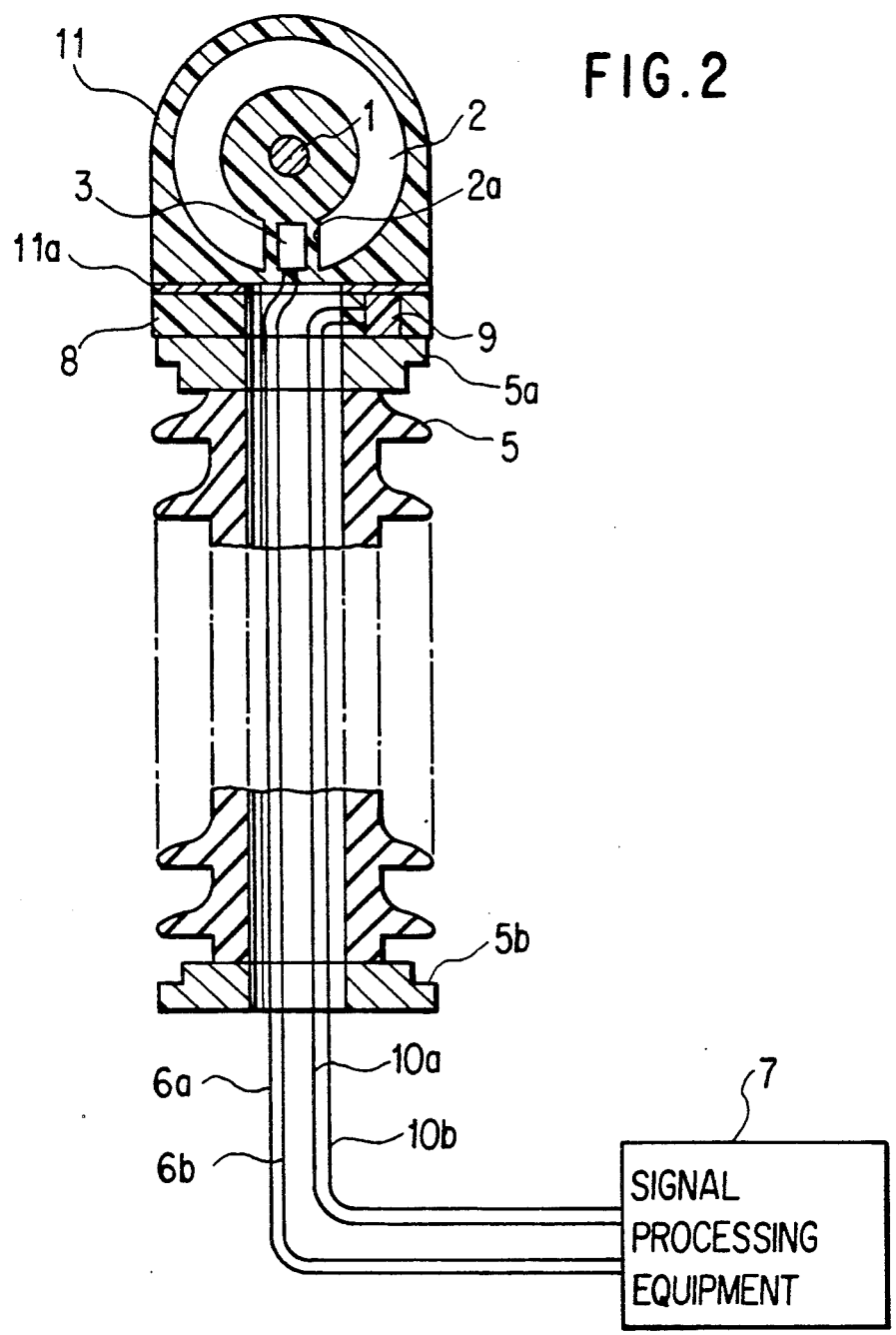
FIG. 2 is a partial cutaway view of a second embodiment of an optical instrument transformer in accordance with the present invention.

FIG. 2 is a partial cutaway view of a second embodiment of an optical instrument transformer in accordance with the present invention. Corresponding parts and components to the first embodiment are shown by the same numerals and marks, and the description thereon made in the first embodiment similarly apply. Differences and features of this second embodiment from the first embodiment are as follows.

In the second embodiment, an insulator 11 as a mold member, made of e.g. synthetic resin or rubber, supports the iron core 2 and the optical magnetic-field sensor 3 in an integral body. The insulator 11 has a conductor part 11a made of a metal plate under its lower surface. Thereby the smaller-sized and light integral optical instrument transformer is obtained. Further, since the iron core 2 and the optical magnetic-field sensor 3 are formed in the integral body, a deviation of a positional relation between the iron core 2 and the optical magnetic-field sensor 3 is unlikely to take place. So it leads an effect which is more improved accuracy of measurement.

Figure 3:
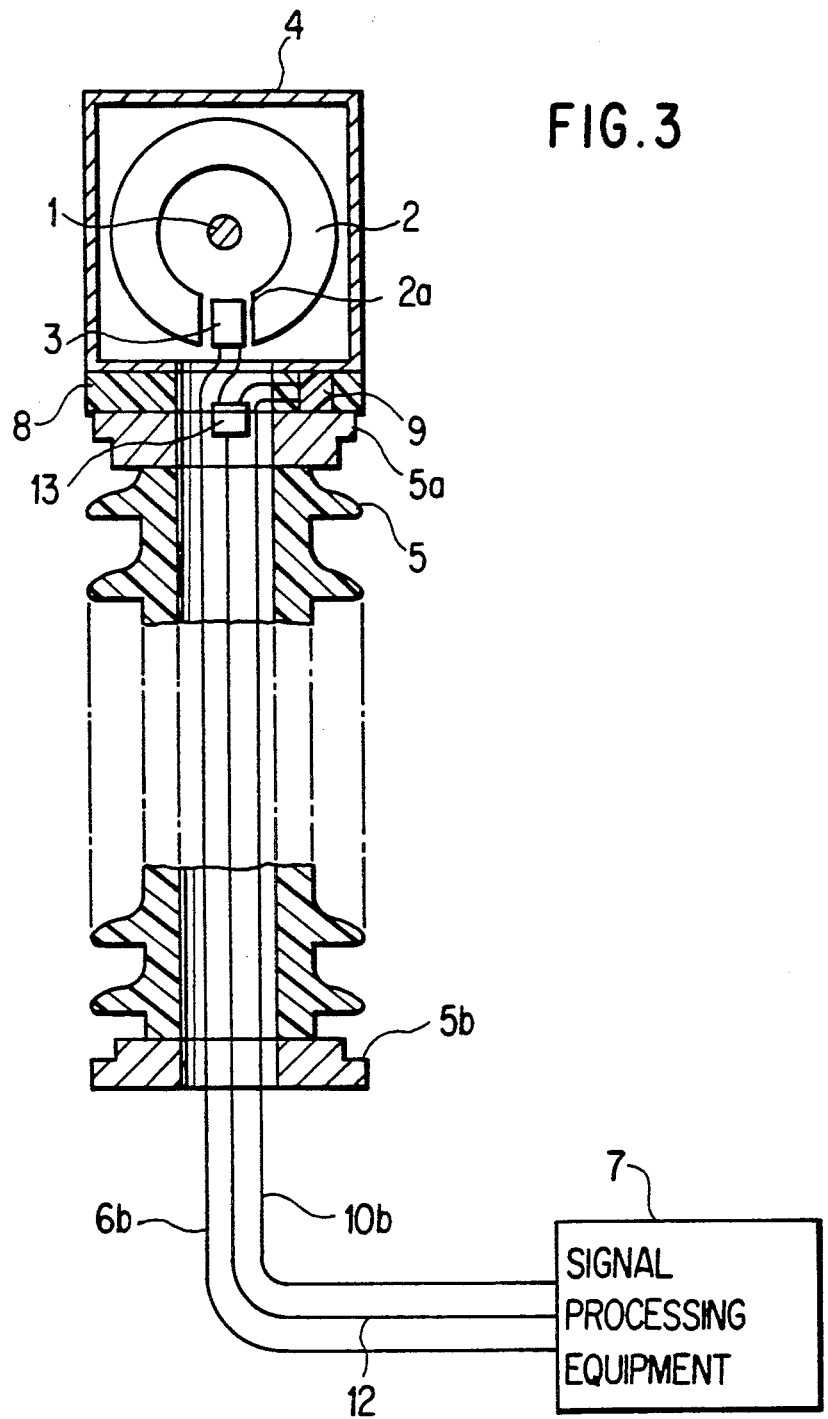
FIG. 3 is a partial cutaway view of a third embodiment of an optical instrument transformer in accordance with the present invention.
Figure 4:
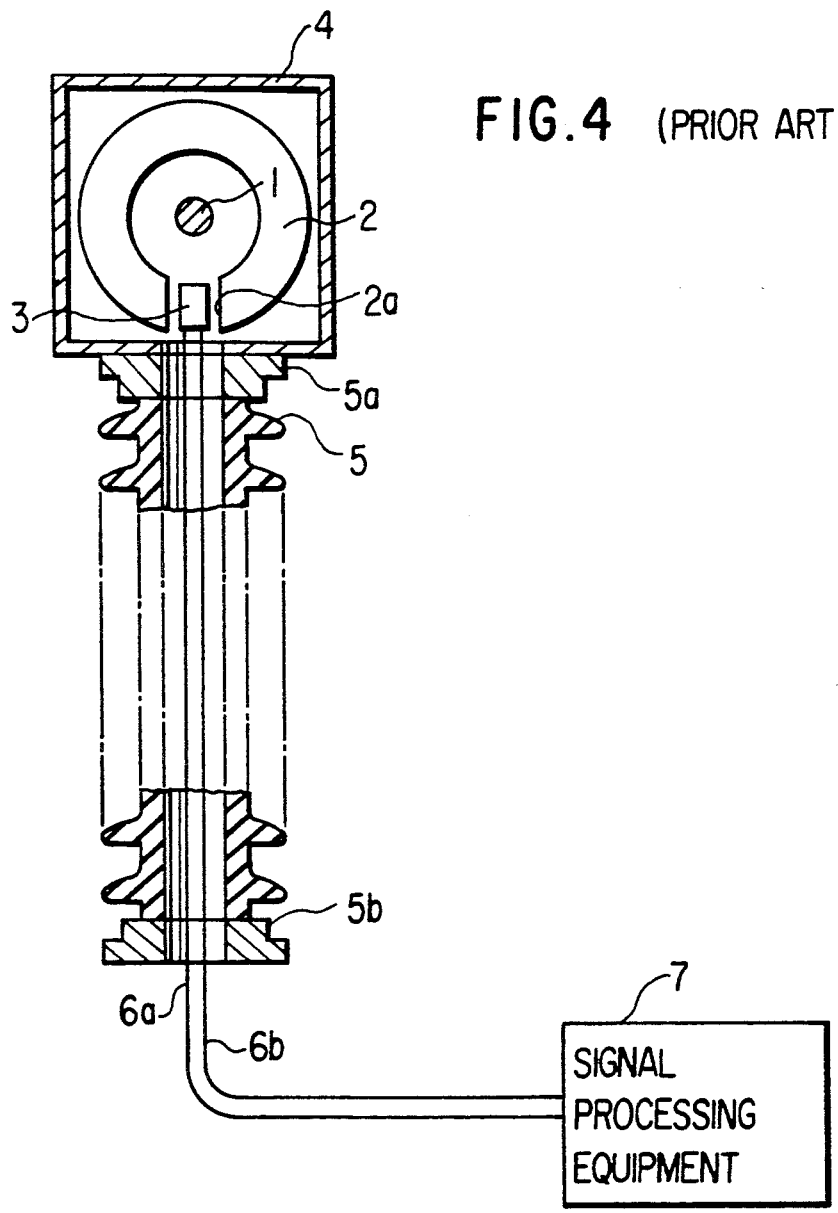
FIG. 4 is the partial cutaway view showing the conventional optical current transformer.

FIG. 3 is a partial cutaway view of a third embodiment of an optical instrument transformer in accordance with the present invention. Corresponding parts and components to the first embodiment are shown by the same numerals and marks, and the description thereon made in the first embodiment similarly apply. Differences and features of this third embodiment from the first embodiment are as follows.

In the third embodiment, a beam splitter 13 is disposed near both sensors 3 and 9. The beam splitter 13 divides a light signal which travels through one optical fiber 12 from the signal processing equipment into two separate light signals. That is, the optical fiber 12 is used in common instead of the optical fibers 6a and 10a shown in FIG. 1, and the light emitting element of the signal processing equipment 7 is used in common for the optical magnetic-field sensor 3 and for the optical electric-field sensor 9.

Thereby number of the fibers penetrating through the bushing decreases by one. Accordingly the bushing 5 can be formed to be smaller in size than the bushing 5 shown in FIG. 1, which leads to a smaller sized optical transformer.

Although the invention has been described in its preferred form with a certain degree of particularity, it is understood that the present disclosure of the preferred form has been changed in the details of construction and the combination and arrangement of parts may be resorted to without departing from the spirit and the scope of the invention as hereinafter claimed.

What is claimed:

1. An optical instrument transformer comprising:
   a primary conductor through which a current flows and which is at a voltage;
   an iron core with a gap in which a magnetic flux is generated as a result of the current flowing through the primary conductor;
   an optical magnetic-field sensor located in the gap of said iron core;
   a conductor member of a conductor material for supporting said iron core;
   a brushing comprising a metal flange at a top end thereof which insulates said metal flange from ground;
   an insulating support means provided between the metal flange and said conductor member;
   an optical electric-field sensor disposed between said conductor member and said metal flange; and
   signal processing equipment optically connected with said optical magnetic-field sensor and said optical electric-field sensor by optic fibers, which emits an output light signal to said optical magnetic-field sensor and said optical electric-field sensor and receives an input light signal modulated by said sensors and measures voltage and current of the primary conductor.

2. The optical instrument transformer according to claim 1, wherein said conductor member has a case integral therewith, said case containing said iron core therein.

3. The optical instrument transformer according to claim 1, wherein said optical electric-field sensor measures the voltage of the primary conductor as an function of the voltage Vd across the conductor member and metal flange.

4. The optical instrument transformer according to claim 3, wherein the voltage Vd across the conductor member and metal flange is expressed by $$Vd = [C_1/(C_1+C_2)] \cdot V$$

where $C_1$ = a capacitance between the conductor member and the metal flange, $C_2$ = a capacitance between the metal flange and ground, and V = a voltage of the primary conductor.

5. An optical instrument transformer in accordance with claim 1, wherein
   said conductor member has mold member thereon, said mold member burying said iron core therein.

6. An optical instrument transformer in accordance with claim 1 further comprising:
   a beamsplitter for dividing said light signal sent out from said signal processing equipment.

* * * * *